United States Patent
Ku et al.

(10) Patent No.: US 11,037,632 B1
(45) Date of Patent: Jun. 15, 2021

(54) MULTI-TIER 3D MEMORY AND ERASE METHOD THEREOF

(71) Applicant: MACRONIX INTERNATIONAL CO., LTD., Hsinchu (TW)

(72) Inventors: Shaw-Hung Ku, Hsinchu (TW); Chih-Chieh Cheng, Zhubei (TW); Cheng-Hsien Cheng, Yunlin County (TW); Yu-Hung Huang, Tainan (TW); Atsuhiro Suzuki, Hsinchu (TW); Wen-Jer Tsai, Hualien (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/828,997

(22) Filed: Mar. 25, 2020

(51) Int. Cl.
  *G11C 11/56* (2006.01)
  *G11C 16/16* (2006.01)
  *G11C 16/34* (2006.01)
  *G11C 16/04* (2006.01)

(52) U.S. Cl.
  CPC .......... *G11C 16/16* (2013.01); *G11C 16/3445* (2013.01); *G11C 16/0483* (2013.01)

(58) Field of Classification Search
  CPC ............................ G11C 16/16; G11C 16/3445
  USPC .................................................... 365/185.29
  See application file for complete search history.

(56) References Cited

U.S. PATENT DOCUMENTS

| | | | |
|---|---|---|---|
| 8,488,382 B1 | 7/2013 | Li et al. | |
| 8,787,094 B2 | 7/2014 | Costa et al. | |
| 10,346,088 B2 * | 7/2019 | Righetti | G11C 16/3445 |
| 2017/0345506 A1 * | 11/2017 | Tanzawa | G11C 16/16 |
| 2019/0102104 A1 * | 4/2019 | Righetti | G06F 3/0652 |

FOREIGN PATENT DOCUMENTS

| | | |
|---|---|---|
| TW | 201407622 A | 2/2014 |
| TW | I559313 B | 11/2016 |

OTHER PUBLICATIONS

Jeong, et al.: "Improving NAND Endurance by Dynamic Program and Erase Scaling"; Jun. 27-28, 2013; Department of Computer Science and Engineering, Seoul National University, Korea; pp. 1-5.
TW Office Action dated May 29, 2020 in Taiwan application (No. 109109917).

* cited by examiner

*Primary Examiner* — Xiaochun L Chen
(74) *Attorney, Agent, or Firm* — McClure, Qualey & Rodack, LLP

(57) ABSTRACT

Provided is an erase method for a multi-tier three-dimension (3D) memory including a plurality of tiers and a plurality of blocks, each of the tiers including a plurality of word lines. The erase method includes: in erasing a selected block among the plurality of blocks, in a current iteration, selecting at least one tier among the plurality of tiers to be erased by a first erase voltage; determining whether the at least one tier passes erase verification; and if the at least one tier passes erase verification, in a next iteration, inhibiting the at least tier which already passes erase verification from erase.

8 Claims, 11 Drawing Sheets

MULTI-TIER 3D MEMORY AND ERASE METHOD THEREOF

TECHNICAL FIELD

The disclosure relates in general to a multi-tier three-dimension (3D) memory and an erase method thereof.

BACKGROUND

Three-dimension (3D) memory is developed for increasing memory storage density. In 3D memory, a plurality of word lines are grouped into multi-tier, for example, two-tier or three-tier. Each word line may be also referred as one layer because the word lines are arranged horizontally.

In erase operation of the 3D memory, the erase unit is a block. A block includes a plurality of cells. In erase operation, the selected block is erased successfully if all cells of the selected block have respective threshold voltages lower than the erase verify voltage. However, in erasing, as for the same selected block, some cells may have threshold voltages lower than the erase verify voltage while other cells may have threshold voltages higher than the erase verify voltage. If so, then the erase voltage is increased to further lower the threshold voltages of the cells of the selected block. But, the increased erase voltage also erases the cells whose threshold voltages lower than the erase verify voltage; and thus the cells whose threshold voltages lower than the erase verify voltage may be further damaged by the erase voltage.

Thus, the disclosure provides a multi-tier 3D memory and the erase operation thereof to solve the above or other problems.

SUMMARY

According to one embodiment, provided is an erase method for a multi-tier three-dimension (3D) memory including a plurality of tiers and a plurality of blocks, each of the tiers including a plurality of word lines, the erase method including: in erasing a selected block among the plurality of blocks, in a current iteration, selecting at least one tier among the plurality of tiers to be erased by a first erase voltage; determining whether the at least one tier passes erase verification; and if the at least one tier passes erase verification, in a next iteration, inhibiting the at least tier which already passes erase verification from erase.

According to one embodiment, provided is an erase method for a multi-tier three-dimension (3D) memory including a plurality of tiers and a plurality of blocks, each of the tiers including a plurality of word lines, the erase method including: in erasing a selected block among the plurality of blocks, in a current iteration, selecting a first tier group among the plurality of tiers to be erased by a first erase voltage and inhibiting a second tier group among the plurality of tiers from erase, members of the first tier group and the second tier group are not repeated; determining whether the first tier group passes erase verification; and if the first tier group passes erase verification, in a next iteration, selecting a third tier group among the plurality of tiers to be erased by a second erase voltage and inhibiting a fourth tier group among the plurality of tiers from erase, members of the third tier group and the fourth tier group are not repeated, and the third tier group includes the first tier group.

According to one embodiment, provided is a multi-tier three-dimension (3D) memory including: a 3D memory array including a plurality of tiers and a plurality of blocks each of the tiers including a plurality of word lines; and a controller coupled to the 3D memory array. The controller performs: in erasing a selected block among the plurality of blocks, in a current iteration, selecting at least one tier among the plurality of tiers to be erased by a first erase voltage; determining whether the at least one tier passes erase verification; and if the at least one tier passes erase verification, in a next iteration, inhibiting the at least tier which already passes erase verification from erase.

Figure 1:
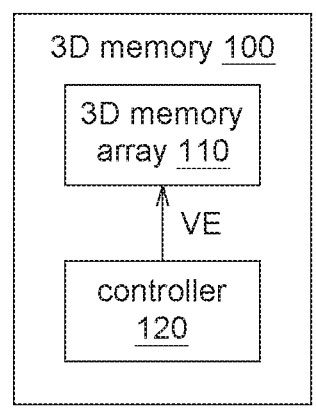
FIG. 1 shows a functional block diagram of a 3D memory according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a functional block diagram of a 3D memory according to one embodiment of the application. As shown in FIG. 1, the 3D memory 100 according to one embodiment of the application includes a 3D memory array 110 and a controller 120. The 3D memory array 110 is coupled to the controller 120. The controller 120 may control operations (for example, erase operations, programming operations) of the 3D memory array 110. Details of the erase operation of one embodiment of the application are described.

Figure 2:
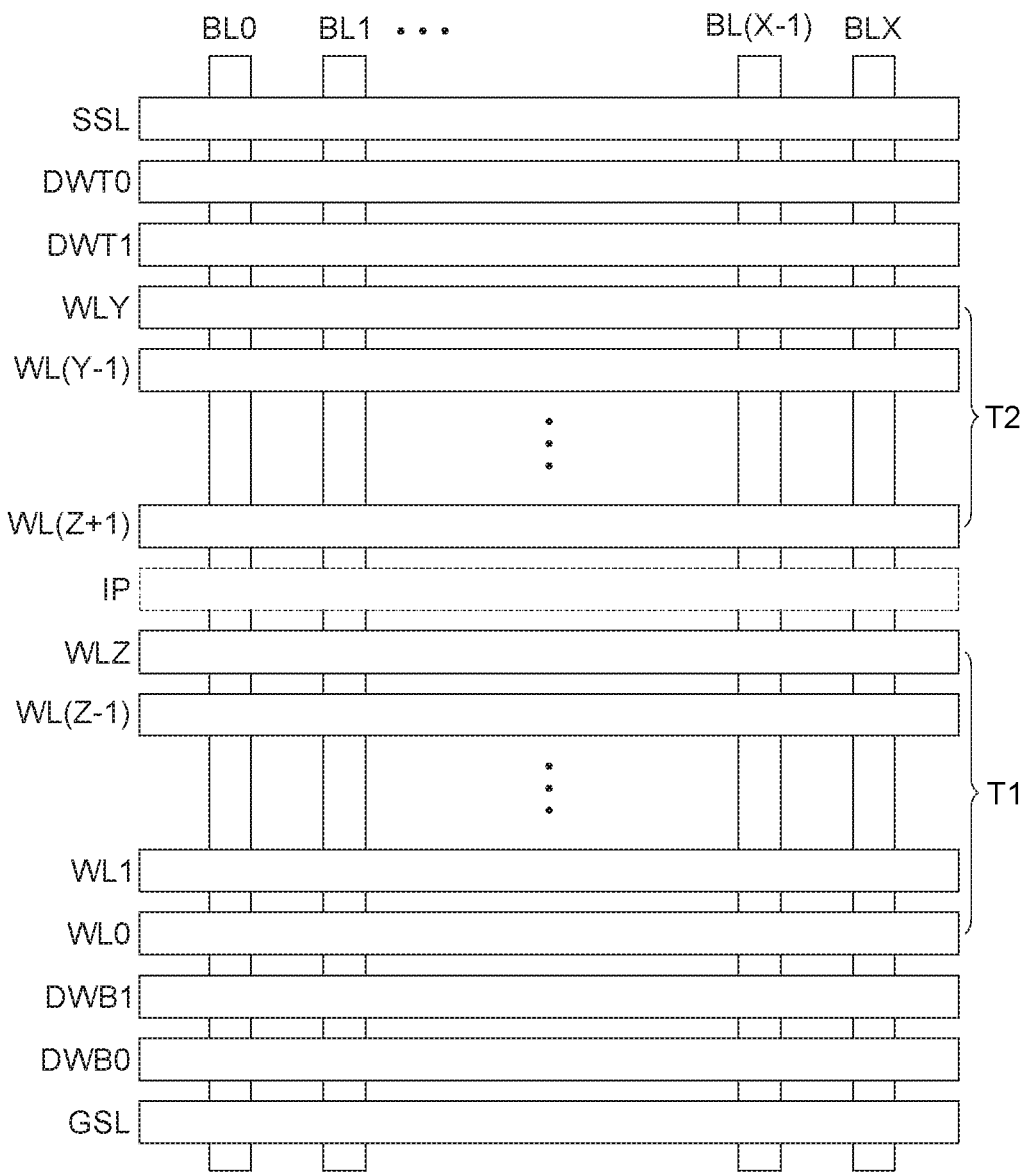
FIG. 2 shows a 3D memory array according to one embodiment of the application.

FIG. 2 shows the 3D memory array 110 according to one embodiment of the application. The 3D memory array 110 includes: a string select line SSL, a global select line GSL, a plurality of dummy word lines (for example but not limited by, DWT0, DWT1, DWB0 and DWB1), a plurality of word lines WL0~WLY (Y being a positive integer) and a plurality of bit lines BL0~BLX (X being a positive integer). The word lines WL0~WLZ (Z being a positive integer) are grouped as the first tier T1 and the word lines WL(Z+1)~WLY are grouped as the second tier T2. An isolation pad IP is formed between the first tier T1 and the second tier T2 for isolating the two adjacent tiers T1 and T2. Of course, FIG. 2 is an example of word line grouping of the 3D memory array according to one embodiment of the application. In fact, if needed, the word lines may be grouped into more tiers and respective isolation pads are formed between any two adjacent tiers. These are still within spirit and scope of the application. As shown in FIG. 2, each of the first tier T1 and the second tier T2 includes a plurality of word lines. In one embodiment, each of the first tier T1 and the second tier T2 includes 64 word lines. Thus, the 3D memory array has total 120 layers (i.e. 128 word lines). By this tier arrangement, the 3D memory array having more than 100 layers (i.e. 100 word lines) are facilitated.

Figure 3A:
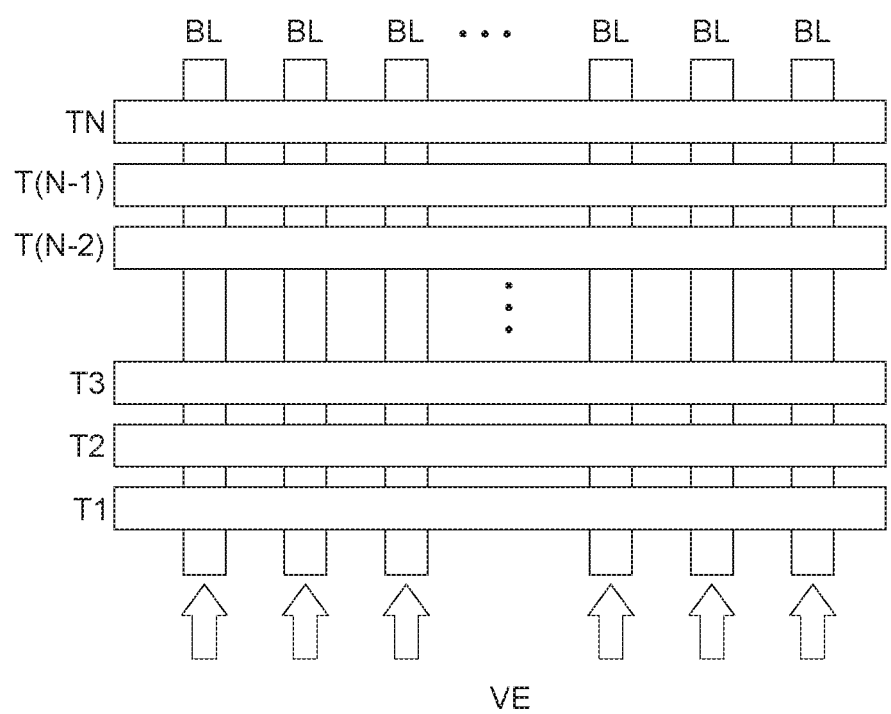
FIG. 3A shows word line grouping of the 3D memory array according to one embodiment of the application.
Figure 3B:
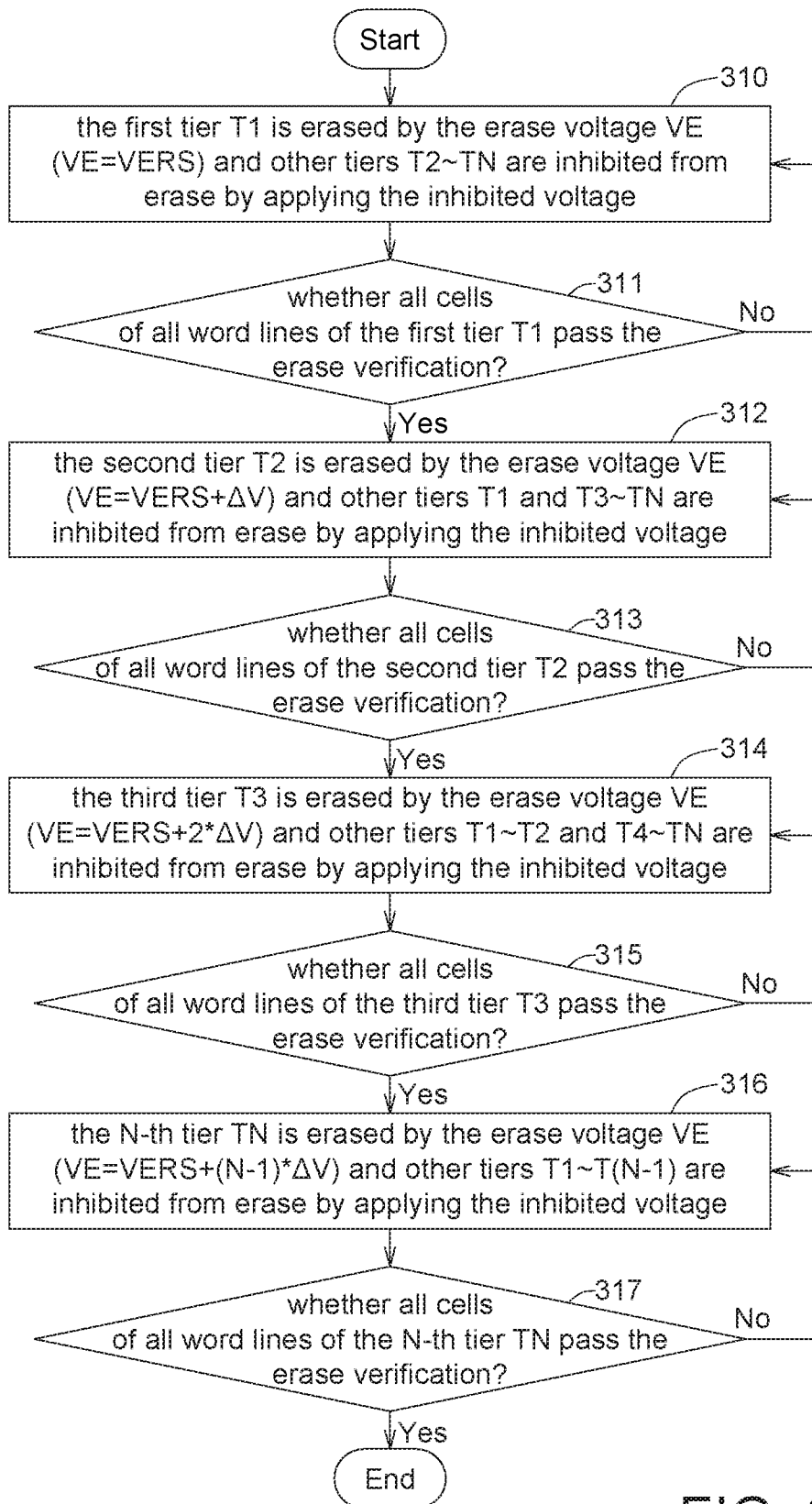
FIG. 3B to FIG. 3D show several erase operations for word line grouping of FIG. 3A according to embodiments of the application.
Figure 3C:
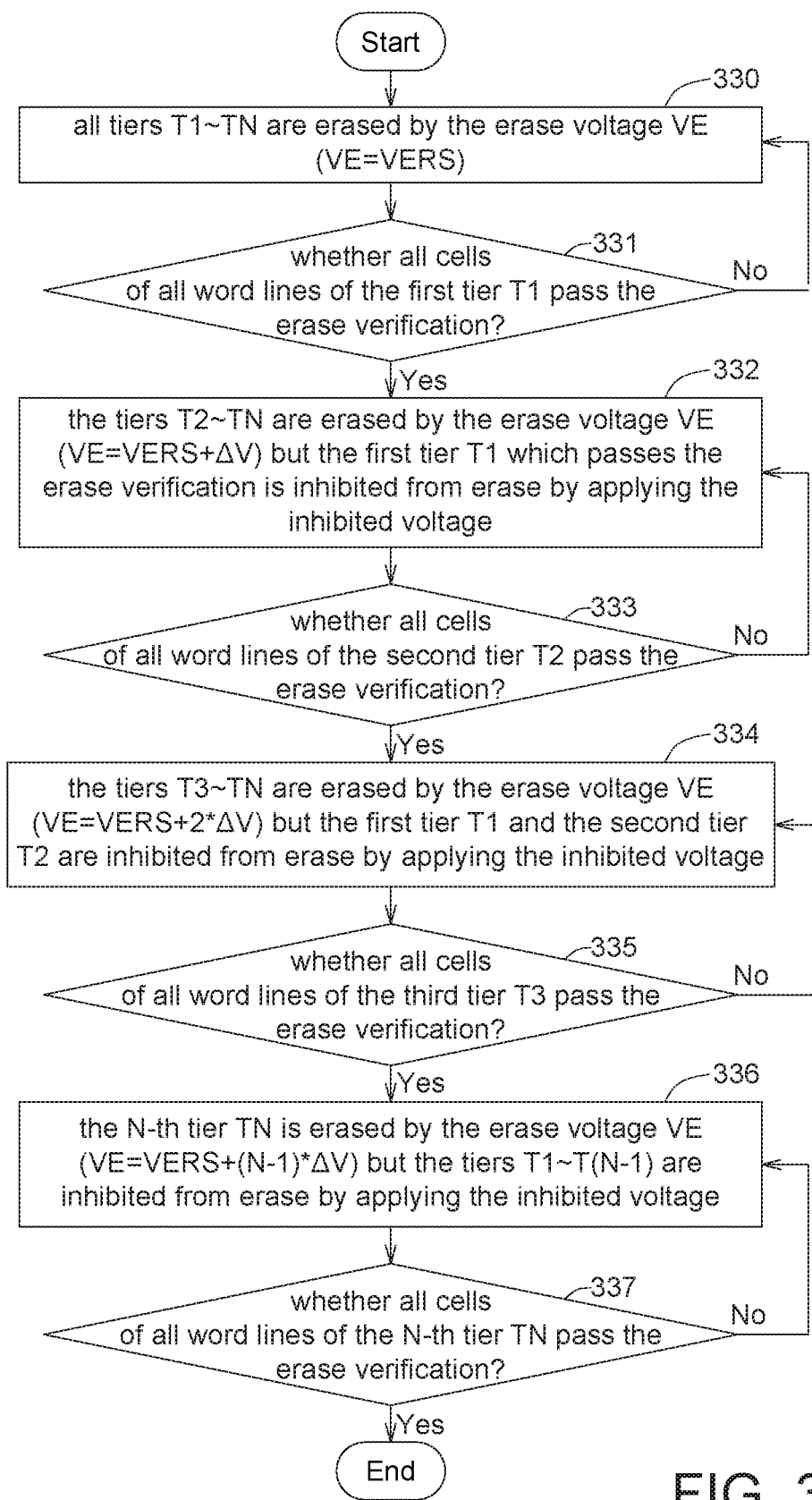
Figure 3D:
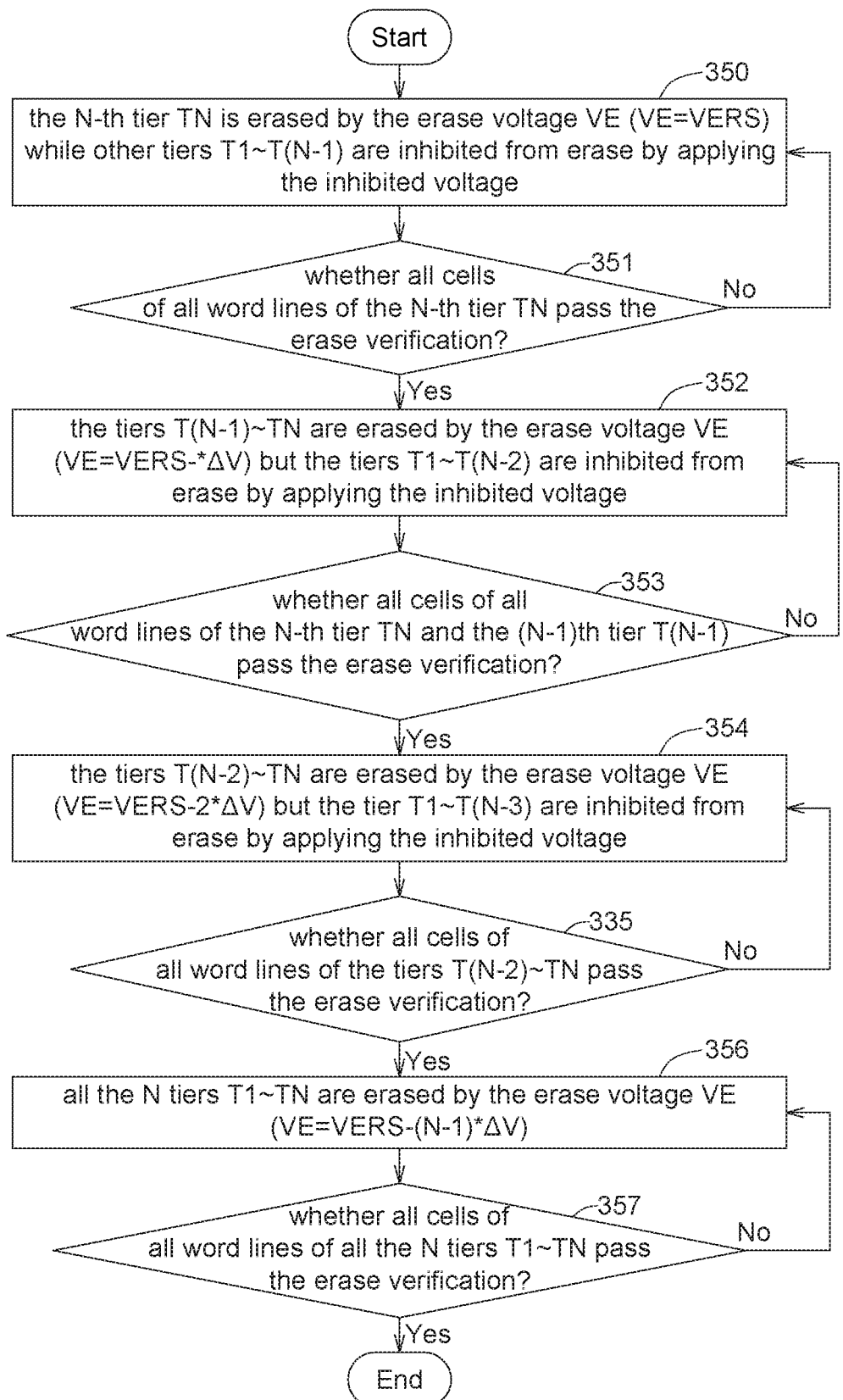

FIG. 3A shows word line grouping of the 3D memory array according to one embodiment of the application. FIG. 3B to FIG. 3D show several erase operations for word line grouping of FIG. 3A according to embodiments of the application.

As shown in FIG. 3A, the word lines of the 3D memory array 110 are grouped into N tiers T1~TN, wherein N is a positive integer. That is, the word lines WL0~WLY of FIG. 2 are grouped into N tiers T1~TN. Word line amount of each tier may be the same or different. In FIG. 3A, the tier T1 refers to the bottom tier while the erase voltage VE (applied to the selected bit lines) is applied to the bottom of the selected bit lines and transmitted to the top of the selected bit lines. In FIG. 3A, the erase voltage VE is applied to one side of the selected bit lines (i.e. to the bottom of the selected bit lines).

Now refer to FIG. 3B. As shown in FIG. 3B, in the erase operation, in the first iteration (step 310), the first tier T1 is erased by the erase voltage VE (VE=VERS) and other tiers T2~TN are inhibited from erase by applying the inhibited voltage. "VERS" refers to a reference erase voltage.

In step 311, it is checked whether all cells of all word lines of the first tier T1 pass the erase verification (i.e. it is checked that whether respective threshold voltages of all cells of all word lines of the first tier T1 are lower than the erase verification voltage). If step 311 is yes, then the flow proceeds to the next step. If step 311 is no, then the flow returns to the step 310 to increase the erase voltage VE until all cells of all word lines of the first tier T1 pass the erase verification.

In the second iteration (step 312), the second tier T2 is erased by the erase voltage VE (VE=VERS+ΔV) and other tiers T1 and T3~TN are inhibited from erase by applying the inhibited voltage, wherein ΔV refers to an erase voltage difference value.

In step 313, it is checked whether all cells of all word lines of the second tier T2 pass the erase verification. If step 313 is yes, then the flow proceeds to the next step. If step 313 is no, then the flow returns to the step 312 to increase the erase voltage VE until all cells of all word lines of the second tier T2 pass the erase verification.

In the third iteration (step 314), the third tier T3 is erased by the erase voltage VE (VE=VERS+2*ΔV) and other tiers T1~T2 and T4~TN are inhibited from erase by applying the inhibited voltage.

In step 315, it is checked whether all cells of all word lines of the third tier T3 pass the erase verification. If step 315 is yes, then the flow proceeds to the next step. If step 315 is no, then the flow returns to the step 314 to increase the erase voltage VE until all cells of all word lines of the third tier T3 pass the erase verification.

The above iterations and the above steps are repeated.

In the N-th iteration (step 316), the N-th tier TN is erased by the erase voltage VE (VE=VERS+(N−1)*ΔV) and other tiers T1~T(N−1) are inhibited from erase by applying the inhibited voltage.

In step 317, it is checked whether all cells of all word lines of the N-th tier TN pass the erase verification. If step 317 is yes, then the flow ends. If step 317 is no, then the flow returns to the step 316 to increase the erase voltage VE until all cells of all word lines of the N-th tier TN pass the erase verification.

Now refer to FIG. 3C. As shown in FIG. 3C, in the erase operation, in the first iteration (step 330), all tiers T1~TN are erased by the erase voltage VE (VE=VERS).

In step 331, it is checked whether all cells of all word lines of the first tier T1 pass the erase verification. If step 331 is yes, then the flow proceeds to the next step. If step 331 is no, then the flow returns to the step 330 to increase the erase voltage VE until all cells of all word lines of the first tier T1 pass the erase verification.

In the second iteration (step 332), the tiers T2~TN are erased by the erase voltage VE (VE=VERS+ΔV) but the first tier T1 which passes the erase verification is inhibited from erase by applying the inhibited voltage.

In step 333, it is checked whether all cells of all word lines of the second tier T2 pass the erase verification. If step 333 is yes, then the flow proceeds to the next step. If step 333 is no, then the flow returns to the step 332 to increase the erase voltage VE until all cells of all word lines of the second tier T2 pass the erase verification.

In the third iteration (step 334), the tiers T3~TN are erased by the erase voltage VE (VE=VERS+2*ΔV) but the first tier T1 and the second tier T2 which pass the erase verification are inhibited from erase by applying the inhibited voltage.

In step 335, it is checked whether all cells of all word lines of the third tier T3 pass the erase verification. If step 335 is yes, then the flow proceeds to the next step. If step 335 is no, then the flow returns to the step 334 to increase the erase voltage VE until all cells of all word lines of the third tier T3 pass the erase verification.

The above iterations and the above steps are repeated.

In the N-th iteration (step 336), the N-th tier TN is erased by the erase voltage VE (VE=VERS+(N−1)*ΔV) but the tiers T1~T(N−1) which pass the erase verification are inhibited from erase by applying the inhibited voltage.

In step 337, it is checked whether all cells of all word lines of the N-th tier TN pass the erase verification. If step 337 is yes, then the flow ends. If step 337 is no, then the flow returns to the step 336 to increase the erase voltage VE until all cells of all word lines of the N-th tier TN pass the erase verification.

Now refer to FIG. 3D. As shown in FIG. 3D, in the erase operation, in the first iteration (step 350), the N-th tier TN is erased by the erase voltage VE (VE=VERS) while other tiers T1~T(N−1) are inhibited from erase by applying the inhibited voltage. In here, the N-th tier TN is selected as a first tier group which is erased while other tiers T1~T(N−1) are selected as a second tier group which is inhibited from erase. Respective members of the first tier group and the second tier are not repeated from each other.

In step 351, it is checked whether all cells of all word lines of the N-th tier TN pass the erase verification. If step 351 is yes, then the flow proceeds to the next step. If step 351 is no, then the flow returns to the step 350 to increase the erase voltage VE until all cells of all word lines of the N-th tier TN pass the erase verification.

In the second iteration (step 352), the tiers T(N−1)~TN are erased by the erase voltage VE (VE=VERS−*ΔV) but the tiers T1~T(N−2) are inhibited from erase by applying the inhibited voltage. In here, the N-th tier TN and the (N−1)th tier T(N−1) are selected as a third tier group which is erased while other tiers T1~T(N−2) are selected as a fourth tier group which is inhibited from erase. Respective members of the third tier group and the fourth tier are not repeated from each other.

In step 353, it is checked whether all cells of all word lines of the N-th tier TN and the (N−1)th tier T(N−1) pass the erase verification. If step 353 is yes, then the flow proceeds to the next step. If step 353 is no, then the flow returns to the step 352 to increase the erase voltage VE until all cells of all word lines of the N-th tier TN and the (N−1)th tier T(N−1) pass the erase verification.

In the third iteration (step 354), the tiers T(N−2)~TN are erased by the erase voltage VE (VE=VERS−2*ΔV) but the tier T1~T(N−3) are inhibited from erase by applying the inhibited voltage.

In step 355, it is checked whether all cells of all word lines of the tiers T(N−2)~TN pass the erase verification. If step 355 is yes, then the flow proceeds to the next step. If step 355 is no, then the flow returns to the step 354 to increase the erase voltage VE until all cells of all word lines of the tiers T(N−2)~TN pass the erase verification.

The above iterations and the above steps are repeated.

In the N-th iteration (step 356), all the N tiers T1~TN are erased by the erase voltage VE (VE=VERS−(N−1)*ΔV).

In step 357, it is checked whether all cells of all word lines of all the N tiers T1~TN pass the erase verification. If step 357 is yes, then the flow ends. If step 357 is no, then the flow returns to the step 356 to increase the erase voltage VE until all cells of all word lines of all the N tiers T1~TN pass the erase verification.

In the embodiments of FIG. 3B-FIG. 3C, the erase voltage is inhibited from being applied to the tiers which already pass the erase verification. On the other hand, in the embodiment of FIG. 3D, when the erase voltage is applied to the erase-verification-pass tiers, the erase voltage is gradually decreased. By so, the embodiments of FIG. 3B-FIG. 3D may protect the erase-verification-pass tiers from being further damaged by the erase voltage applied in the subsequent iterations.

Figure 4A:
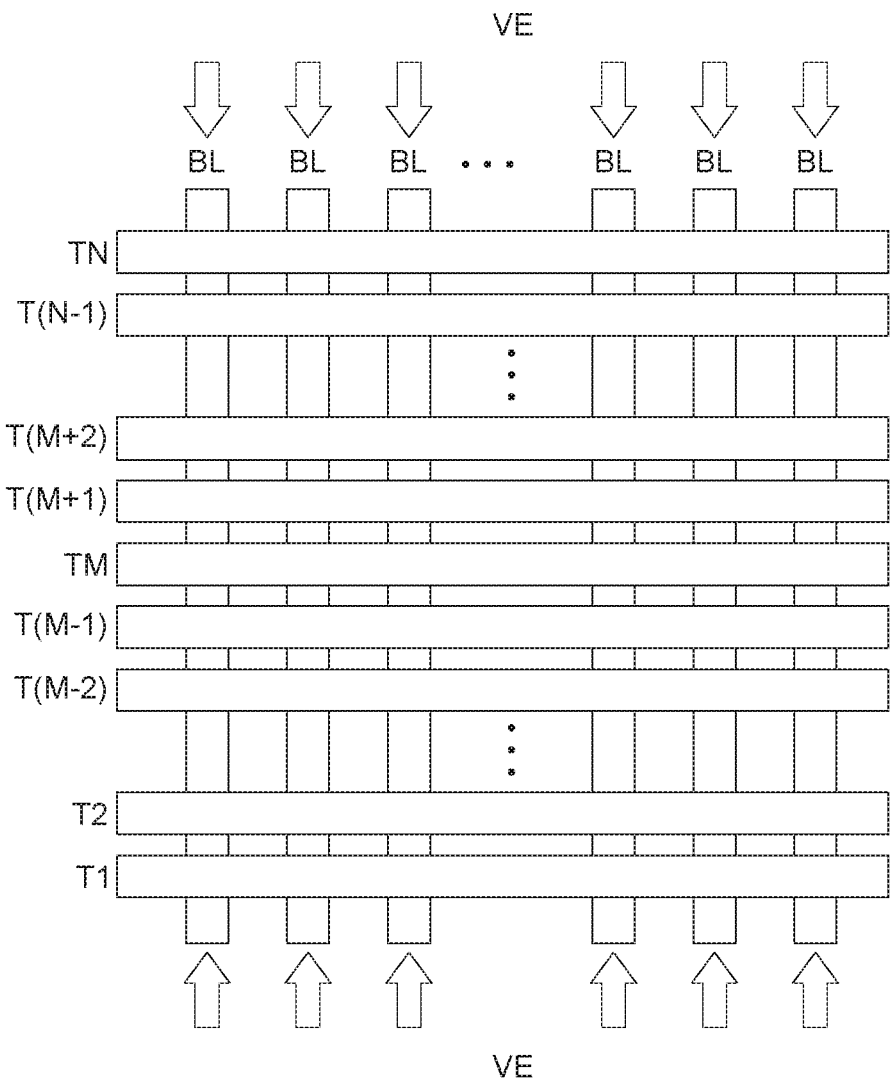
FIG. 4A shows another word line grouping of the 3D memory array according to one embodiment of the application.
Figure 4B:
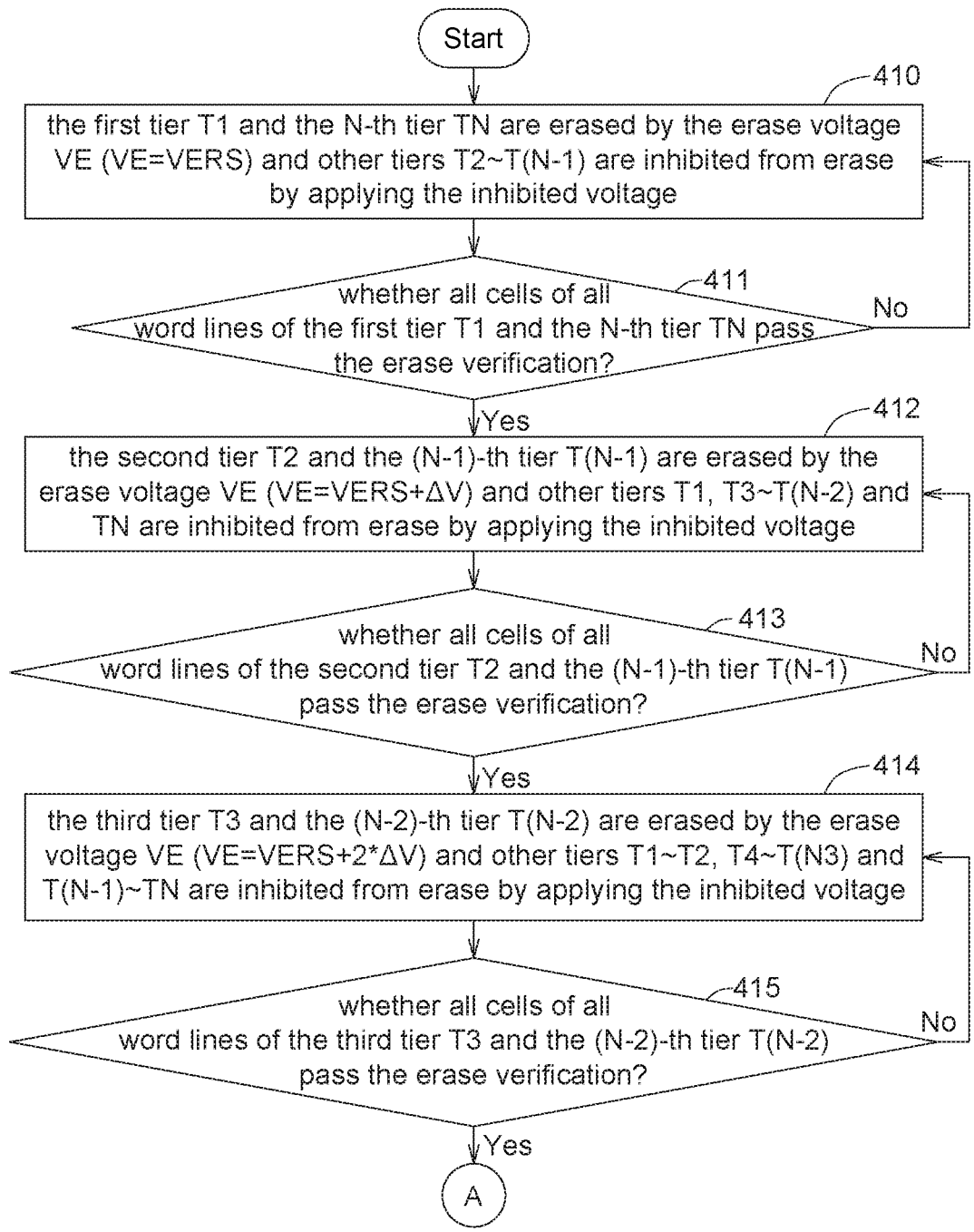
FIG. 4B to FIG. 4D show several erase operations for word line grouping of FIG. 4A according to embodiments of the application.
Figure 4C:
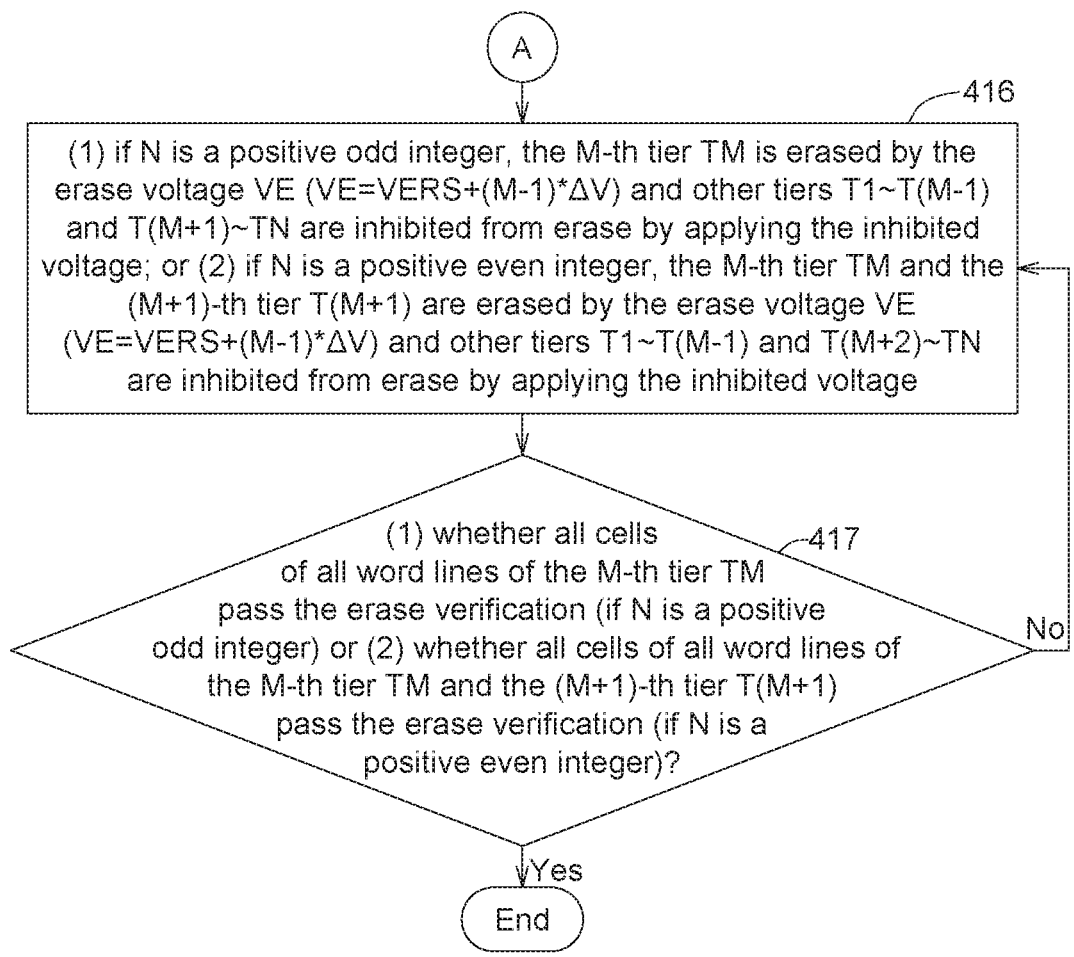

FIG. 4A shows another word line grouping of the 3D memory array according to one embodiment of the application. FIG. 4B to FIG. 4C show several erase operations for word line grouping of FIG. 4A according to embodiments of the application. Different from FIG. 3A, in FIG. 4A, the erase voltage is applied to both sides of the selected bit lines. That is, in FIG. 4A, the erase voltage VE is applied to the top and the bottom of the selected bit lines, and transmitted to the middle of the selected bit lines. Thus, in FIG. 4A, "TM" refers to the middle tier (i.e. the M-th tier), wherein M=(N+1)/2 (when N is a positive odd integer) or M=N/2 (when N is a positive even integer).

Refer to FIG. 4B and FIG. 4C. As shown in FIG. 4B and FIG. 4C, in the erase operation, in the first iteration (step 410), the first tier T1 and the N-th tier TN are erased by the erase voltage VE (VE=VERS) and other tiers T2~T(N−1) are inhibited from erase by applying the inhibited voltage.

In step 411, it is checked whether all cells of all word lines of the first tier T1 and the N-th tier TN pass the erase verification (i.e. it is checked that whether respective threshold voltages of all cells of all word lines of the first tier T1 and the N-th tier TN are lower than the erase verification voltage). If step 411 is yes, then the flow proceeds to the next step. If step 411 is no, then the flow returns to the step 410 to increase the erase voltage VE until all cells of all word lines of the first tier T1 and the N-th tier TN pass the erase verification.

In the second iteration (step 412), the second tier T2 and the (N−1)-th tier T(N−1) are erased by the erase voltage VE (VE=VERS+ΔV) and other tiers T1, T3~T(N−2) and TN are inhibited from erase by applying the inhibited voltage (VE=VERS+ΔV).

In step 413, it is checked whether all cells of all word lines of the second tier T2 and the (N−1)-th tier T(N−1) pass the erase verification. If step 413 is yes, then the flow proceeds to the next step. If step 413 is no, then the flow returns to the step 412 to increase the erase voltage VE until all cells of all word lines of the second tier T2 and the (N−1)-th tier T(N−1) pass the erase verification.

In the third iteration (step 414), the third tier T3 and the (N−2)-th tier T(N−2) are erased by the erase voltage VE (VE=VERS+2*ΔV) and other tiers T1~T2, T4~T(N3) and T(N−1)~TN are inhibited from erase by applying the inhibited voltage.

In step 415, it is checked whether all cells of all word lines of the third tier T3 and the (N−2)-th tier T(N−2) pass the erase verification. If step 415 is yes, then the flow proceeds to the next step. If step 415 is no, then the flow returns to the step 414 to increase the erase voltage VE until all cells of all word lines of the third tier T3 and the (N−2)-th tier T(N−2) pass the erase verification.

The above iterations and the above steps are repeated.

In the M-th iteration (step 416), (1) if N is a positive odd integer, the M-th tier TM is erased by the erase voltage VE (VE=VERS+(M−1)*ΔV) and other tiers T1~T(M−1) and T(M+1)~TN are inhibited from erase by applying the inhibited voltage; or (2) if N is a positive even integer, the M-th tier TM and the (M+1)-th tier T(M+1) are erased by the erase voltage VE (VE=VERS+(M−1)*ΔV) and other tiers T1~T(M−1) and T(M+2)~TN are inhibited from erase by applying the inhibited voltage.

In step 417, it is checked (1) whether all cells of all word lines of the M-th tier TM pass the erase verification (if N is a positive odd integer) or (2) whether all cells of all word lines of the M-th tier TM and the (M+1)-th tier T(M+1) pass the erase verification (if N is a positive even integer). If step 417 is yes, then the flow ends. If step 417 is no, then the flow returns to the step 416 to increase the erase voltage VE until (1) all cells of all word lines of the M-th tier TM pass the erase verification (if N is a positive odd integer) or (2) all cells of all word lines of the M-th tier TM and the (M+1)-th tier T(M+1) pass the erase verification (if N is a positive even integer).

Figure 4D:
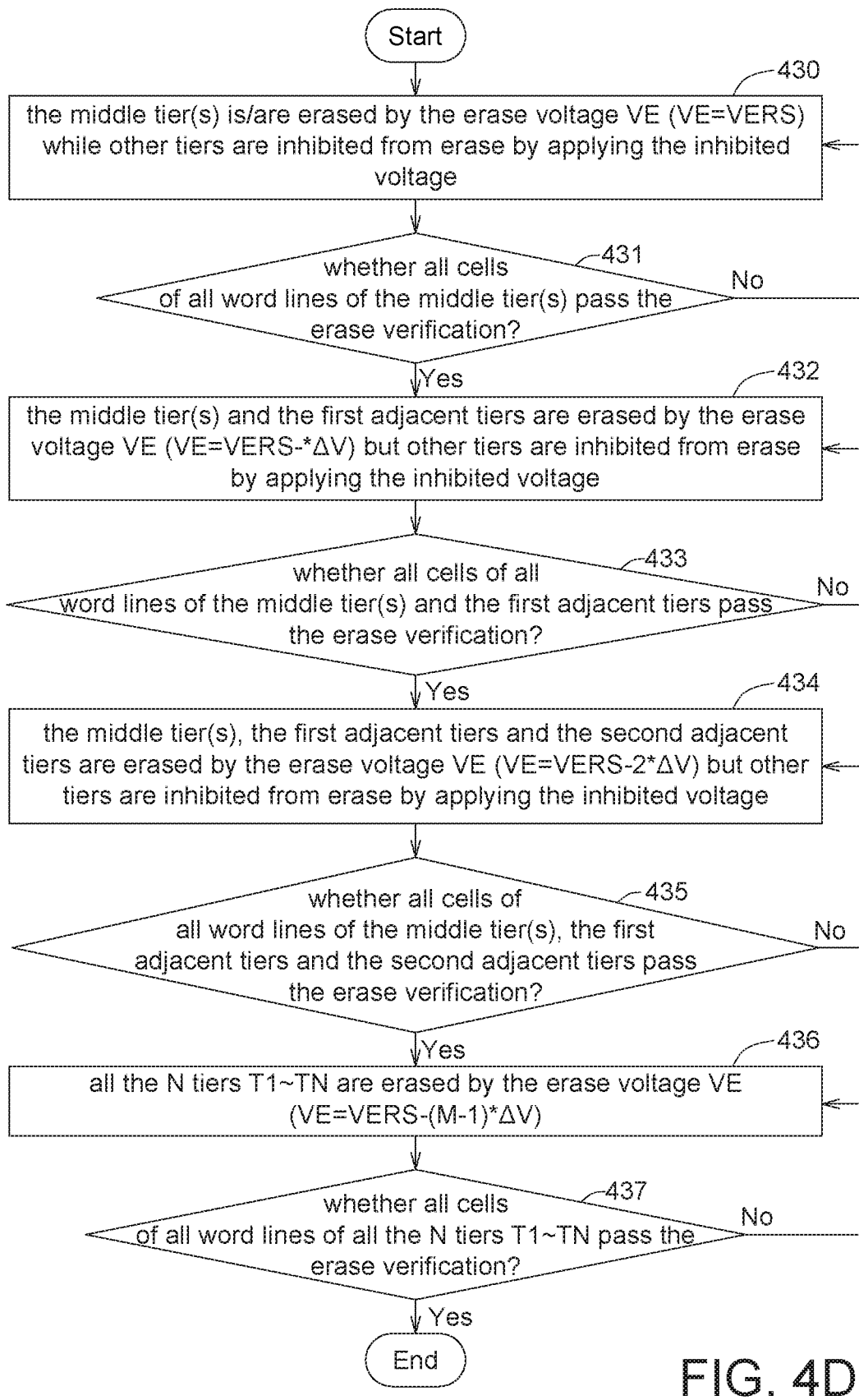

Now refer to FIG. 4D. As shown in FIG. 4D, in the erase operation, in the first iteration (step 430), the middle tier(s) is/are erased by the erase voltage VE (VE=VERS) while other tiers are inhibited from erase by applying the inhibited voltage. The middle tier(s) is/are (1) the M-th tier TM (if N is a positive odd integer) or (2) the M-th tier TM and the (M+1)-th tier T(M+1) (if N is a positive even integer). In here, the selected tier(s) which is/are to be erased by the erase voltage is also called as "the first tier group) and the tiers which are inhibited from erase is also called as "the second tier group).

In step 431, it is checked whether all cells of all word lines of the middle tier(s) pass the erase verification. If step 431 is yes, then the flow proceeds to the next step. If step 431 is no, then the flow returns to the step 430 to increase the erase voltage VE until all cells of all word lines of the middle tier(s) pass the erase verification.

In the second iteration (step 432), the middle tier(s) and the first adjacent tiers are erased by the erase voltage VE (VE=VERS−*ΔV) but other tiers are inhibited from erase by applying the inhibited voltage. If N is a positive odd number, then the middle tier(s) is the M-th tier TM and the first adjacent tiers are the (M−1)-th tier T(M−1) and the (M+1)-th tier T(M+1). If N is a positive even number, then the middle tiers are the M-th tier TM and the (M+1)-th tier T(M+1), and the first adjacent tiers are the (M−1)-th tier T(M−1) and the (M+2)-th tier T(M+2). The first adjacent tiers refer to the upper tier and the lower tier which are adjacent and closest to the middle tier(s). Inhere, the tier(s) which are to be erased by the erase voltage are also referred as a third tier group while other tiers which are inhibited from erase are referred as a fourth tier group.

In step 433, it is checked whether all cells of all word lines of the middle tier(s) and the first adjacent tiers pass the erase verification. If step 433 is yes, then the flow proceeds to the next step. If step 433 is no, then the flow returns to the step 432 to increase the erase voltage VE until all cells of all word lines of the middle tier(s) and the first adjacent tiers pass the erase verification.

In the third iteration (step 434), the middle tier(s), the first adjacent tiers and the second adjacent tiers are erased by the erase voltage VE (VE=VERS−2*ΔV) but other tiers are inhibited from erase by applying the inhibited voltage. If N is a positive odd number, then the middle tier(s) is the M-th tier TM, the first adjacent tiers are the (M−1)-th tier T(M−1) and the (M+1)-th tier T(M+1), and the second adjacent tiers are the (M−2)-th tier T(M−2) and the (M+2)-th tier T(M+2). If N is a positive even number, then the middle tiers are the M-th tier TM and the (M+1)-th tier T(M+1), the first adjacent tiers are the (M−1)-th tier T(M−1) and the (M+2)-th tier T(M+2), and the second adjacent tiers are the (M−2)-th tier T(M−2) and the (M+3)-th tier T(M+3). The second adjacent tiers refer to the upper second tier and the lower second tier which are close to the middle tier(s).

In step 435, it is checked whether all cells of all word lines of the middle tier(s), the first adjacent tiers and the second adjacent tiers pass the erase verification. If step 435 is yes, then the flow proceeds to the next step. If step 435 is no, then the flow returns to the step 434 to increase the erase voltage VE until all cells of all word lines of the middle tier(s), the first adjacent tiers and the second adjacent tiers pass the erase verification.

The above iterations and the above steps are repeated.

In the M-th iteration (step 437), all the N tiers T1~TN are erased by the erase voltage VE (VE=VERS−(M−1)*ΔV).

In step 437, it is checked whether all cells of all word lines of all the N tiers T1~TN pass the erase verification. If step 437 is yes, then the flow ends. If step 437 is no, then the flow returns to the step 436 to increase the erase voltage VE until all cells of all word lines of all the N tiers T1~TN pass the erase verification.

In the embodiment of FIG. 4B, the erase voltage is inhibited from being applied to the tiers which already pass the erase verification. On the other hand, in the embodiment of FIG. 4C, when the erase voltage is applied to the erase-verification-pass tiers, the erase voltage is gradually decreased. By so, the embodiments of FIG. 4B-FIG. 4C may protect the erase-verification-pass tiers from being further damaged by the erase voltage applied in the subsequent iterations.

Figure 5:
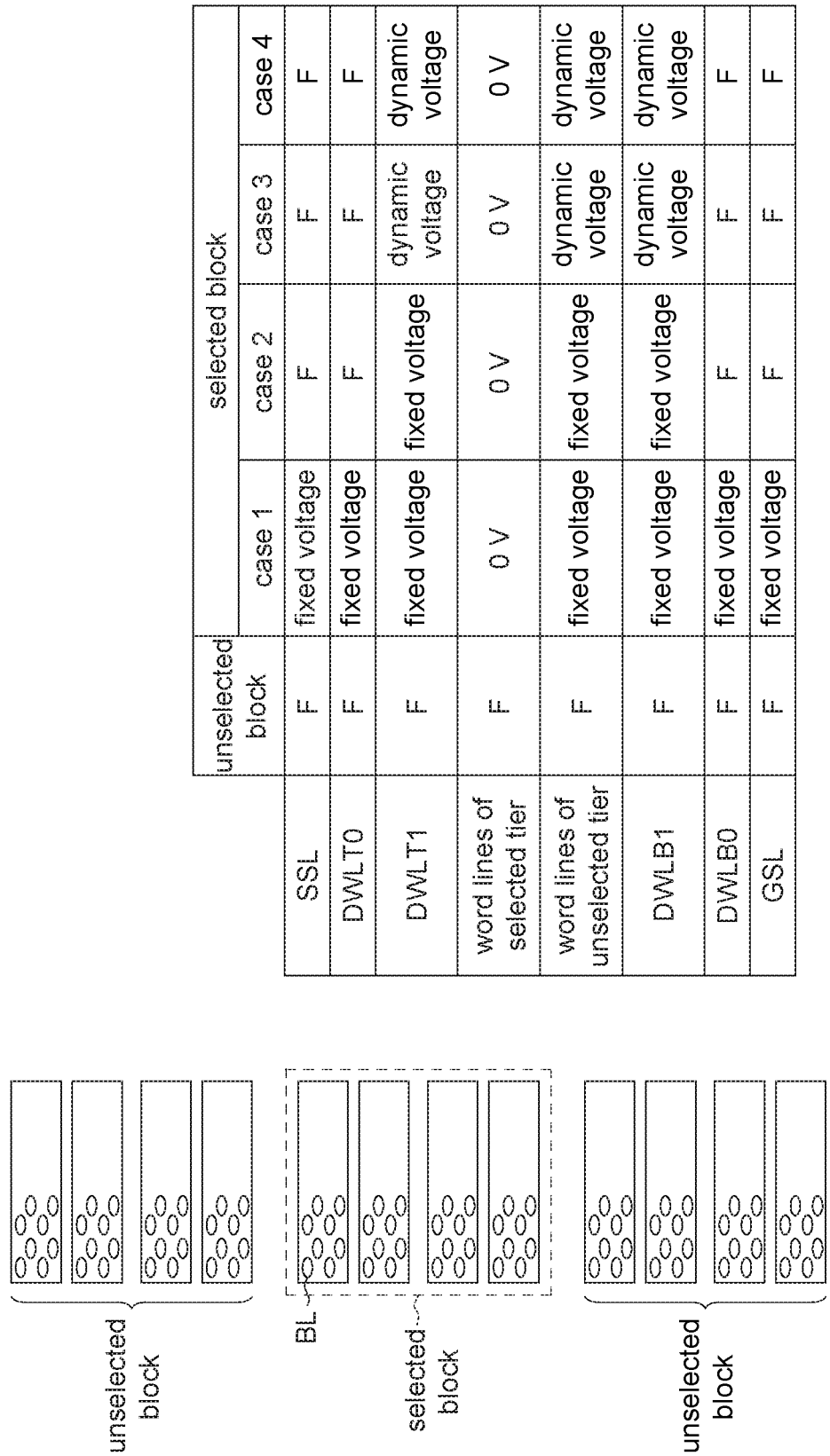
FIG. 5 shows an upper view diagram of the 3D memory array and voltage application condition according to one embodiment of the application.

FIG. 5 shows an upper view diagram of the 3D memory array 110 and voltage application condition according to one embodiment of the application. For simplicity, in FIG. 5, the selected block (that is, the block which is selected to be erased) is surrounded by the dotted lines and the circle in FIG. 5 refers to the bit lines. Table in FIG. 5 shows the voltage setting condition for the selected block and the unselected block. In the table of FIG. 5, "F" indicates that no voltage is applied. As shown in FIG. 5, the 3D memory array 110 includes a plurality of blocks.

In case 1, as for the selected block, the string select line SSL, the global select line GSL, the dummy word lines (DWT0, DWT1, DWB0, DWB1) and the word lines of the unselected tiers are applied by the fixed voltage (for example but not limited by, 8V-12V) and the word lines of the selected tiers are applied by 0V. In here, the selected tier(s) refer(s) to the tier(s) which is/are selected to be erased by the erase voltage while the unselected tier(s) refer(s) to the tier(s) which is/are inhibited from erase. For example, as shown in FIG. 3B, in step 310, the first tier T1 is the selected tier while other tiers T2~TN are the unselected tiers. That is, in case 1, if the word lines of the selected tier is applied by 0V, the switches of the cells of the word lines of the selected tier are conducted and thus the conducted cells are erased by the erase voltage. Similarly, in case 1, if the word lines of the unselected tier is applied by the fixed voltage (i.e. the inhibited voltage), the switches of the cells of the word lines of the unselected tier are disconnected and thus the disconnected cells are not erased. By so, the erase-verification-pass cells are prevented from being further damaged by the erase voltage.

In case 2, as for the selected block, (1) the string select line SSL, the global select line GSL, and the dummy word lines DWT0, DWB0 are not applied by any voltage; (2) the word lines of the unselected tiers and the dummy word lines DWT1, DWB1 are applied by the fixed voltage (for example but not limited by, 8V-12V); and (3) the word lines of the selected tiers are applied by 0V.

In case 3, as for the selected block, (1) the string select line SSL, the global select line GSL, and the dummy word lines DWT0, DWB0 are not applied by any voltage; (2) the dummy word lines DWT1, DWB1 are applied by the dynamic voltage (for example but not limited by, between (VE-V1) and (VE-V2), V1 being for example 8V while V2 being for example 12V); (3) the word lines of the unselected tiers are applied by the fixed voltage (for example but not limited by, 8V-12V); and (4) the word lines of the selected tiers are applied by 0V.

In case 4, as for the selected block, (1) the string select line SSL, the global select line GSL, and the dummy word lines DWT0, DWB0 are not applied by any voltage; (2) the word lines of the unselected tiers and the dummy word lines DWT1, DWB1 are applied by the dynamic voltage (for example but not limited by, between (VE-V1) and (VE-V2), V1 being for example 8V while V2 being for example 12V); and (3) the word lines of the selected tiers are applied by 0V.

In the embodiments of the application, no matter the erase voltage is applied to one side or both sides of the bit lines, the erase-verification-pass tiers are inhibited from erase, or the erase-verification-pass tiers are erased by the reduced erase voltage. Thus, the erase-verification-pass tiers are protected from being further damaged by the erase voltage applied in the subsequent iteration(s).

The embodiments of the application may be applied in 3D flash memory, for example but not limited by vertical channel type 3D flash memories, vertical gate type 3D flash memories, charge trapping type 3D flash memories or floating gate type 3D flash memories.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An erase method for a multi-tier three-dimension (3D) memory including a plurality of tiers, a plurality of bit lines and a plurality of blocks, each of the tiers including a plurality of word lines, the erase method including:
in erasing a selected block among the plurality of blocks,
in a current iteration, selecting at least one tier among the plurality of tiers to be erased by a first erase voltage;
determining whether the at least one tier passes erase verification; and
in response to the at least one tier passes erase verification, in a next iteration, inhibiting the at least one tier which already passes erase verification from erase;
wherein the multi-tier three-dimension memory includes N tiers, N being a positive integer,
in the current iteration, selecting a first tier and a N-th tier among the N tiers to be erased by the first erase voltage, and inhibiting a second tier to a (N−1)-th tier among the N tiers from erase.

2. The erase method according to claim 1, wherein
in response to the first tier and the N-th tier among the N tiers pass erase verification, in the next iteration, erasing the second tier and the (N−1)-th tier by a second erase voltage and inhibiting the first tier, the N-th tier, and a third tier to a (N−2)-th tier from erase, wherein the second erase voltage is higher than the first erase voltage, and the first erase voltage and the second erase voltage are applied to respective two sides of selected bit lines of the bit lines of the multi-tier three-dimension memory.

3. An erase method for a multi-tier three-dimension (3D) memory including a plurality of tiers, a plurality of bit lines and a plurality of blocks, each of the tiers including a plurality of word lines, the erase method including:
in erasing a selected block among the plurality of blocks,
in a current iteration, selecting a first tier group among the plurality of tiers to be erased by a first erase voltage and inhibiting a second tier group among the plurality of tiers from erase, members of the first tier group and the second tier group are not repeated;
determining whether the first tier group passes erase verification; and
in response to the first tier group passes erase verification, in a next iteration, selecting a third tier group among the plurality of tiers to be erased by a second erase voltage and inhibiting a fourth tier group among the plurality of tiers from erase, members of the third tier group and the fourth tier group are not repeated, and the third tier group includes the first tier group.

4. The erase method according to claim 3, wherein the multi-tier three-dimension memory includes N tiers, N being a positive integer,
in the current iteration, selecting a N-th tier among the N tiers as the first tier group to be erased by the first erase voltage, and selecting a first tier to a (N−1)-th tier among the N tiers as the second tier group and inhibiting the second tier group from erase; and
in response to the first tier group passes erase verification, in the next iteration, selecting the N-th tier and the (N−1)-th tier among the N tiers as the third tier group to be erased by the second erase voltage, and selecting the first tier to a (N−2)-th tier among the N tiers as the fourth tier group and inhibiting the second tier group from erase, wherein the second erase voltage is lower than the first erase voltage, and the first erase voltage and the second erase voltage are applied to respective one sides of selected bit lines of the bit lines of the multi-tier three-dimension memory.

5. The erase method according to claim 3, wherein the multi-tier three-dimension memory includes N tiers, N being a positive odd integer and M=(N+1)/2,
in the current iteration, selecting a M-th tier among the N tiers as the first tier group to be erased by the first erase voltage, and selecting a first tier to a (M−1)-th tier and a (M+1)-th tier to a N-th tier among the N tiers as the second tier group and inhibiting the second tier group from erase; and
in response to the first tier group passes erase verification, in the next iteration, selecting the M-th tier, the (M−1)-th tier and the (M+1)-th tier among the N tiers as the third tier group to be erased by the second erase voltage, and selecting the first tier to a (M−2)-th tier and a (M+2)-th tier to the N-th tier among the N tiers as the fourth tier group and inhibiting the second tier group from erase, wherein the second erase voltage is lower than the first erase voltage, and the first erase voltage and the second erase voltage are applied to respective two sides of selected bit lines of the bit lines of the multi-tier three-dimension memory.

6. The erase method according to claim 3, wherein the multi-tier three-dimension memory includes N tiers, N being a positive even integer and M=N/2,
in the current iteration, selecting a M-th tier and a (M+1)-th tier among the N tiers as the first tier group to be erased by the first erase voltage, and selecting a first tier to a (M−1)-th tier and a (M+2)-th tier to a N-th tier among the N tiers as the second tier group and inhibiting the second tier group from erase; and
in response to the first tier group passes erase verification, in the next iteration, selecting the M-th tier, the (M−1)-th tier, the (M+1)-th tier and the (M+2)-th tier among the N tiers as the third tier group to be erased by the second erase voltage, and selecting the first tier to a (M−2)-th tier and a (M+3)-th tier to the N-th tier among the N tiers as the fourth tier group and inhibiting the second tier group from erase, wherein the second erase voltage is lower than the first erase voltage, and the first erase voltage and the second erase voltage are applied to respective two sides of selected bit lines of the bit lines of the multi-tier three-dimension memory.

7. A multi-tier three-dimension (3D) memory including:
a 3D memory array including a plurality of tiers, a plurality of bit lines and a plurality of blocks, each of the tiers including a plurality of word lines; and
a controller coupled to the 3D memory array,
wherein the controller performs:
in erasing a selected block among the plurality of blocks,
in a current iteration, selecting at least one tier among the plurality of tiers to be erased by a first erase voltage;
determining whether the at least one tier passes erase verification; and
in response to the at least one tier passes erase verification, in a next iteration, inhibiting the at least one tier which already passes erase verification from erase;
wherein the multi-tier three-dimension memory includes N tiers, N being a positive integer, the controller performs:
in the current iteration, selecting a first tier and a N-th tier among the N tiers to be erased by the first erase voltage, and inhibiting a second tier to a (N−1)-th tier among the N tiers from erase.

8. The multi-tier three-dimension memory according to claim 7, wherein
in response to the first tier and the N-th tier among the N tiers pass erase verification, in the next iteration, erasing the second tier and the (N−1)-th tier by a second erase voltage and inhibiting the first tier, the N-th tier, and a third tier to a (N−2)-th tier from erase, wherein the second erase voltage is higher than the first erase voltage, and the first erase voltage and the second erase voltage are applied to respective two sides of selected bit lines of the bit lines of the multi-tier three-dimension memory.

* * * * *